(12) United States Patent
Thies et al.

(10) Patent No.: US 6,807,078 B2
(45) Date of Patent: Oct. 19, 2004

(54) SEMICONDUCTOR INPUT/OUTPUT CIRCUIT ARRANGEMENT

(75) Inventors: William Thies, Bristol (GB); Nicolas Froidevaux, Aix en Provence (FR)

(73) Assignee: STMicroelectronics Limited, Bristol (GB)

(*) Notice: Subject to any disclaimer, the term of this patent is extended or adjusted under 35 U.S.C. 154(b) by 0 days.

(21) Appl. No.: 10/229,337

(22) Filed: Aug. 26, 2002

(65) Prior Publication Data

US 2003/0137861 A1 Jul. 24, 2003

(30) Foreign Application Priority Data

Aug. 4, 2001 (EP) ............................................. 01307231

(51) Int. Cl.[7] ................................................. G11C 5/06
(52) U.S. Cl. .............................. 365/63; 365/51; 365/226
(58) Field of Search ............................... 365/63, 51, 226

(56) References Cited

U.S. PATENT DOCUMENTS

| 5,365,091 | A |   | 11/1994 | Yamagishi ................. 257/203 |
| 5,548,135 | A |   | 8/1996  | Avery ....................... 257/173 |
| 5,760,428 | A |   | 6/1998  | Colwell et al. ............ 257/206 |
| 5,777,354 | A |   | 7/1998  | Cheung et al. ............ 257/202 |
| 5,889,713 | A | * | 3/1999  | Chan et al. ................ 365/201 |
| 5,943,254 | A | * | 8/1999  | Bakeman et al. ............ 365/72 |
| 6,078,068 | A |   | 6/2000  | Tamura ..................... 257/203 |
| 6,078,514 | A | * | 6/2000  | Takemae et al. ............. 365/63 |
| 6,130,484 | A |   | 10/2000 | Kameda et al. ............ 257/786 |
| 6,362,497 | B1 |  | 3/2002  | Hiraga ...................... 257/203 |

FOREIGN PATENT DOCUMENTS

| EP | 0 563 973 A2 | 10/1993 |
| EP | 0 660 410 B1 | 6/1995  |

OTHER PUBLICATIONS

Mack, W. et al., "New ESD Protection Schemes for BiCMOS Processes with Application to Cellular Radio Designs," in *Proceedings of the International Symposium on Circuits and Systems, IEEE*, vol. 4, conf. 25, San Diego, May 10–13, 1992, pp. 2699–2702.

* cited by examiner

*Primary Examiner*—Van Thu Nguyen
*Assistant Examiner*—Pho M. Luu
(74) *Attorney, Agent, or Firm*—Lisa K. Jorgenson; Robert Iannucci; Seed IP Law Group PLLC (57) ABSTRACT

A method produces a semiconductor circuit with an area saving in comparison to conventional circuit layouts. IO cells are arranged with a width multiplied by a factor, but with corresponding reduced height. ESD protection circuitry is included at a reduced rate in comparison to usual arrangements. The space saving is achieved by occupying a semiconductor area that would have been used by ESD circuitry with the IO circuitry. ESD protection is maintained but at different locations.

20 Claims, 5 Drawing Sheets

SEMICONDUCTOR INPUT/OUTPUT CIRCUIT ARRANGEMENT

BACKGROUND OF THE INVENTION

1. Field of the Invention

The present invention relates to a semiconductor input/output arrangement, and particularly to an arrangement for reducing the semiconductor area set aside for input and output.

2. Description of the Related Art

Semiconductor circuits comprise an area of silicon onto which different circuit components are formed by doping with various chemical constituents. Such doping forms multiple devices such as latches and transistors to create memory and processing circuitry as is well known to those skilled in the art. To connect exterior components to the circuit, pins, balls or other connections are provided which connect to pads which in turn connect to the semiconductor circuit via input/output circuitry. Such arrangements are known. The problem with such arrangements, however, is the ever increasing requirement for millions of components to be constructed on a given circuit. This results in increased area of silicon used and greater cost. We have appreciated the need to minimize the area of a semiconductor circuit required for input/output connection.

Semiconductor circuit design typically uses a "library" approach in which divisible parts of circuits are designed and implemented in repeating arrangements. The divisible parts are referred to as library cells. We have further appreciated that circuit design using libraries should use area efficiently for input/output connection.

BRIEF SUMMARY OF THE INVENTION

In a broad aspect, the invention provides a semiconductor circuit arrangement and design methodology in which active circuitry, input/output circuitry and input/output pads are provided, and the protection circuitry is provided as library cells at a reduced frequency than usual.

In particular, there is provided a method of producing a semiconductor circuit with an area saving in comparison with a conventional circuit using library cells, the circuit having active circuitry, an input/output interface comprising separate IO cells and pads for external connection to the active circuitry via the IO cells, comprising:

determining the ratio of power/ground pads to input/output pads for the interface in the conventional circuit;

determining the width of each IO cell of the conventional circuit;

producing IO cells of a width substantially equal to the width of each IO cell of the conventional circuit multiplied by a factor based on the ratio of power/ground pads to input/output pads, but of corresponding reduced height; and producing power/ground pads and input/output pads for connection to the IO cells grouped together in the ratio determined for the conventional circuit.

The invention is defined in the claims to which reference is now directed.

BRIEF DESCRIPTION OF THE SEVERAL VIEWS OF THE DRAWINGS

An embodiment of the invention will now be described by way of example only, and with reference to the accompanying figures, in which.

DETAILED DESCRIPTION OF THE INVENTION

A semiconductor circuit comprises a core or active circuitry, input/output circuitry, pads for power/ground and input/output connection and pins for external connection. A typical semiconductor circuit which may embody the invention is shown in FIG. 1.

The core or active circuitry 10 comprises the components which undertake the circuit functions. These could be memory or processing functions depending on the purpose of the circuit, and the invention is equally applicable to either. The core 10 connects with surrounding input/output (IO) circuitry 12 which provides an interface between the core and external connections. To provide external connection, individual pads 18 are formed in the silicon in a pad ring 14 which connect with the IO circuitry 12 through deposited metal layers on the circuit. The pads 18 in turn connect to respective pins, balls or substrate 20 for external connection. A schematic cross section of this arrangement is shown in FIG. 2, showing a core 10, IO circuit 14, pads 18 and pins 20 with lead frame or substrate connections 19 there between.

Figure 1:
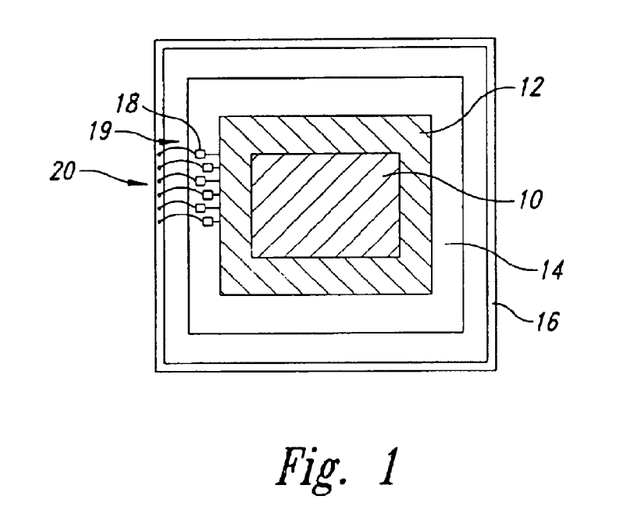
FIG. 1: is a schematic diagram of a semiconductor circuit, including an active area, IO circuit, pad ring and pins.
Figure 2:
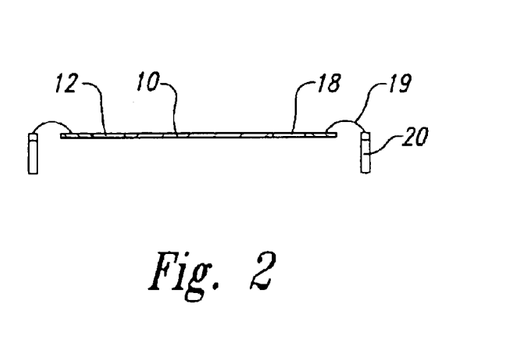
FIG. 2: is a schematic cross section of the semiconductor circuit of FIG. 1.

It will be appreciated that FIGS. 1 and 2 are schematic only, the actual ratio of size between the pads and core is not as shown. Typically, the minimum spacing between the lead frame connections is 65 µm, where the pads 18 are arranged in linear rows or 40 µm, if the pads are arranged in staggered rows as shown. With these as typical size constraints, it can be seen that the area of silicon required by the pad ring is constrained by the number of pads required. Similarly, the IO ring 12 uses silicon area as does the core 10. It is important to ensure that no area is wasted.

Figure 3:
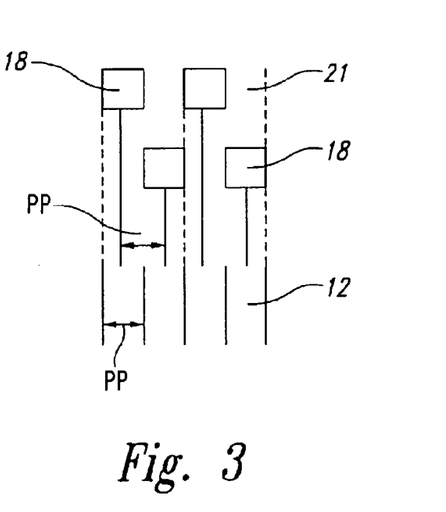
FIG. 3: is a more detailed schematic view of a section of a pad ring.

The area occupied by the pads 18 themselves is only a portion of the pad ring 14 because space is required between the pads to ensure there is no electrical influence there between. As shown in FIG. 3, the pad pitch "pp" depends upon the technology used and the arrangement of the pads and is typically 40 µm. This defines the width of the associated circuitry shown as IO circuitry 12, which includes either IO circuitry or protection circuitry and has the same width as the pad pitch pp so that a modular approach to circuit design may be adopted.

Figure 4A:
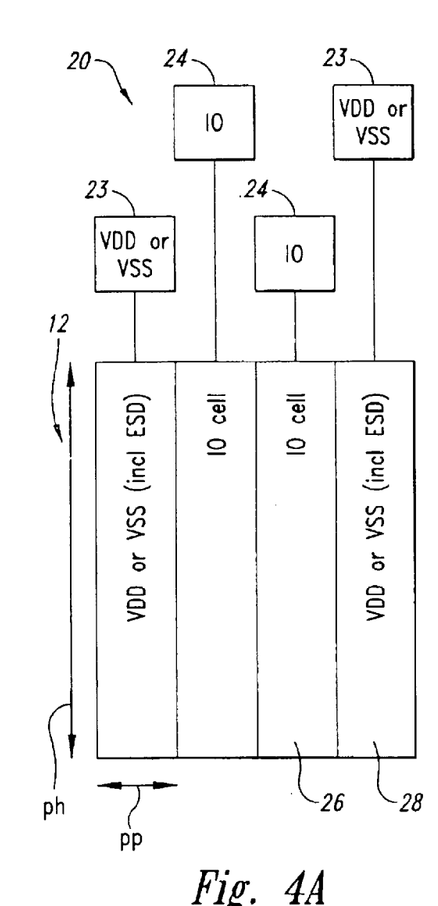
FIGS. 4(a),(b),(c) shows how an existing IO circuit and protection circuit arrangement is modified in accordance with an embodiment of the invention.
Figure 4B:
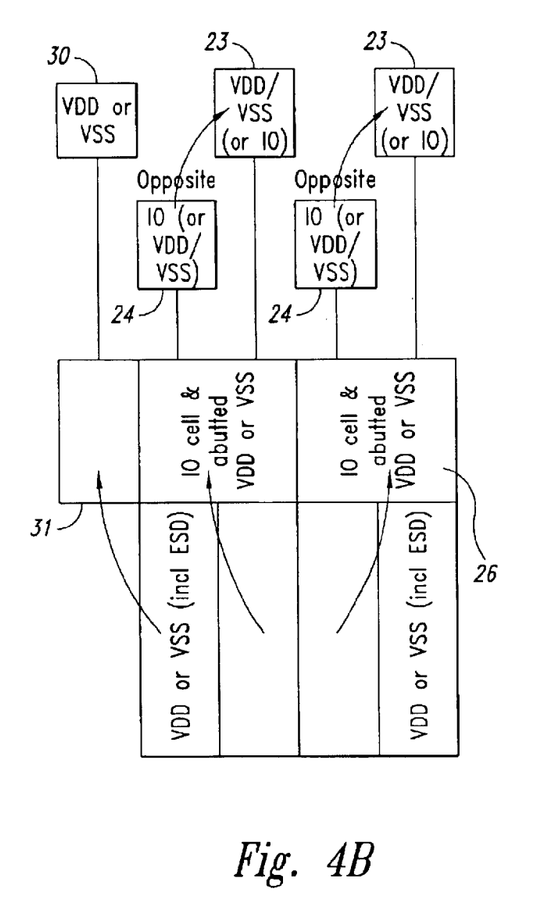
Figure 4C:
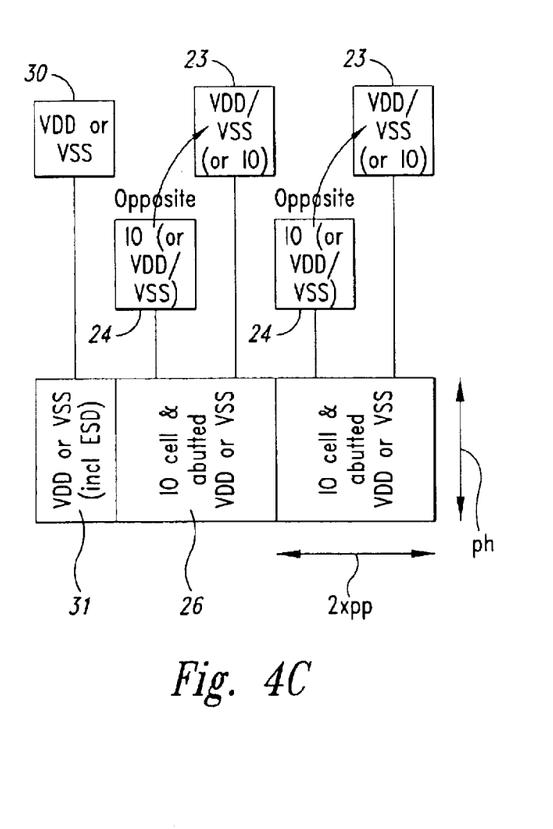

The space occupied by the IO and protection circuitry is at the heart of the present embodiment as shown in FIGS. 4a, b and c.

In FIG. 4a a known pad and IO/protection circuit arrangement is shown. The arrangement comprises IO pads 24 which connect with respective divisible parts of the IO interface known as IO cells 26 which provide an interface to core circuitry (not shown). The IO cells are IO library cells which can be selected and implemented from a library of such cells. The pad pitch "pp" defines the width of each IO cell 26, in this case 40 μm the pad height "ph" is the height of the IO circuitry and hence also the height allocated to electrostatic discharge (ESD) protection circuitry 28, and here is 400 μm. Supply (VDD) and ground (VSS) pads 23 are provided for the IO circuitry and communicate therewith via VDD/VSS connections and ESD circuitry 28 which protects the IO circuit against voltage inversion or overload.

Note that the pads shown as VDD or VSS (supply or ground) are interchangeable in position. The ESD circuitry includes connections to provide supply (VDD) or ground (VSS) connection depending upon the respective associated pin, ball or substrate.

Certain features are apparent from the known arrangement. First, each supply/ground pad for the IO circuitry has an associated ESD space containing ESD circuitry of the same width and height of the IO cell itself. This is provided for protection of the supply/ground of each IO cell (though the ESD circuitry only occupies a portion of the ESD space). Second, this effectively uses an area of silicon of pp×ph×2 for each IO cell and ESD pair, thus each input/output pin requires this area to be set aside in this embodiment (other ratios apply to different circuits).

Although not shown in FIG. 4, there are multiple layers of metal covering the IO cells 26 and ESD circuitry 28 with paths arranged to provide connections between these, and with the active core circuitry. Typically, there are 8 layers of metal, with 3 or 4 of these used for IO connections.

A circuit embodying the invention is shown in FIG. 4(c), with the difference between this circuit and the known circuit shown in FIG. 4(b). The circuit comprises IO pads 24 and supply/ground (VSS/VDD) pads 23 as before. As shown, the pads are interchangeable in position with one another. It will be noted that the ESD circuitry associated with each VDD/VSS pad 23 has now been omitted, and that the IO cell and VDD/VSS connections are formed together as a unitary cell 26. The only ESD protection now provided is ESD circuitry 31 which is provided separately for supply/ground VDD/VSS 30 for the active core, or the IO circuit 26 itself. The VDD/VSS 30 connects to supply/ground rings of metal overlying the IO interface and active circuitry and provide either IO or active power/ground. Similarly, the VDD/VSS 23 associated with each IO cell can provide supply/ground either to the interface, or to the core depending upon the supply/ground ring connections. The omission of ESD circuitry with every IO VDD/VSS is a significant difference and arises from the appreciation that ESD protection does not need to be provided with every VDD/VSS connection, but can be provided between power/ground rings of the metal layers.

The silicon area saving with this circuit arrangement is evident by considering the change in the pad height required. Each IO cell and abutted VDD/VSS connections 26 has an area 2×pp×ph, but the dimension ph is now typically half the dimension in the known arrangement e.g. 200 μm. The total area for each IO cell is thus the same as before, but a saving of area of the ESD circuitry 28 in FIG. 4a is made. As previously noted, this derives from the appreciation that ESD circuitry is not required for every IO cell. The circuit advantageously still uses a fixed pad pitch pp of say 40 μm which allows ease of automatic layout using design tools.

Figure 5A:
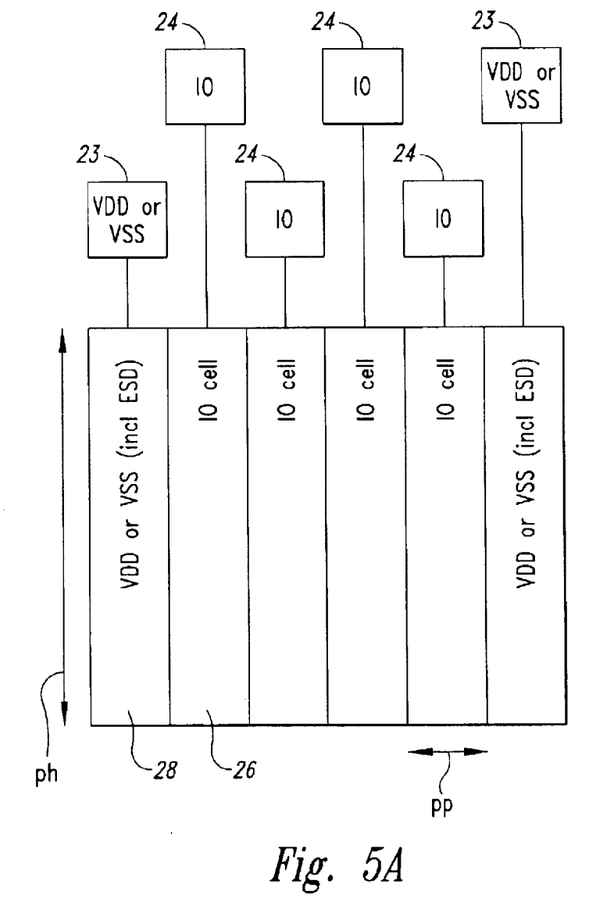
FIGS. 5(a),(b),(c) shows how a second existing IO circuit and protection circuit is modified in accordance with an embodiment of the invention.

A second circuit embodying the invention is shown in FIGS. 5(a),(b) and (c). FIG. 5(a) shows a known arrangement having IO pads 24, supply/ground pads VSS/VDD 23 for the IO circuitry, and IO circuitry itself 26. The pad height ph and pad pitch pp are as before, e.g. ph=400 μm, pp=40 μm. In addition, ESD circuitry 28 is provided for each pair of IO cells. The ratio of IO cells to ESD circuits in the known circuit is thus 2:1, in contrast to the ratio of 1:1 in FIG. 4(a).

Figure 5B:
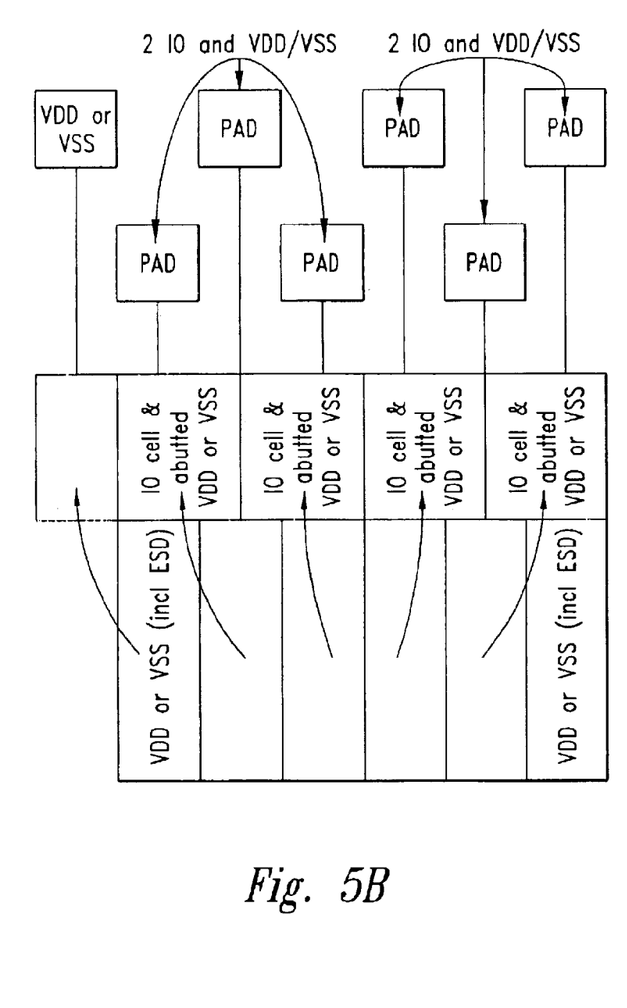
Figure 5C:
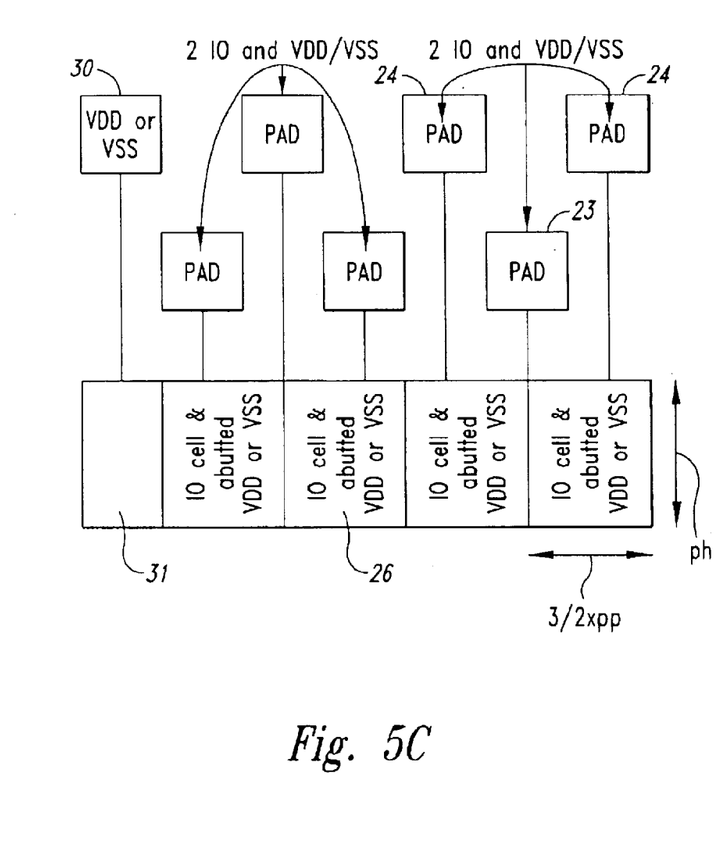

As shown in FIGS. 5(b) and (c), on appreciating that ESD circuitry is not required to be provided with every supply/ground for every IO cell, a saving can be made and the IO circuitry rearranged accordingly. The area saved by omission of each ESD cell is now utilized by two IO cells, with the result that the pad height ph cannot be reduced as much as with the previous example. Nonetheless, it can be seen that a saving is made.

A further benefit of a circuit embodying the invention is that the area occupied by a guard ring is also reduced. A guard ring is provided around IO cells to gather stray electrons and holes. The closer the IO cell is to a minimum circumference (a circle), the lower the length of guard ring required for a given IO circuit area. As can be seen empirically from FIG. 4a, the perimeter of IO cells is greater than for FIG. 4c.

To facilitate automatic layout, certain steps of a design methodology are preferred to achieve the benefits in an embodying circuit.

2. IO/Supply Ratio

The ratio of power/ground pads to IO pads (RPG for short) is used as a constraint in the layout. As shown in FIG. 4(a) the ratio of power/ground to IOs is 2 IOs for a pair of power/ground connection, i.e. RPG=1. In FIG. 4(c), this ratio is maintained with supply/ground and IO pads grouped together in the same ratio. Similarly, in FIG. 5(a) the ratio of power/ground to IOs is 4 IO cells for a power ground pair i.e. RPG=2.

Thus, the layout methodology to vary an existing circuit in accordance with the invention is preferably that IOs and supply/ground pads are grouped together in the RPG ratio as in the known unmodified circuit.

3. Symmetrical Layout

To eliminate any effects due to the chemical deposition process, the IO pads are preferably laid out symmetrically with respect to the IO X axis. This helps to eliminate possible effects due to the angle of chemical deposition.

4. IO Circuit Abutment

Figure 6:
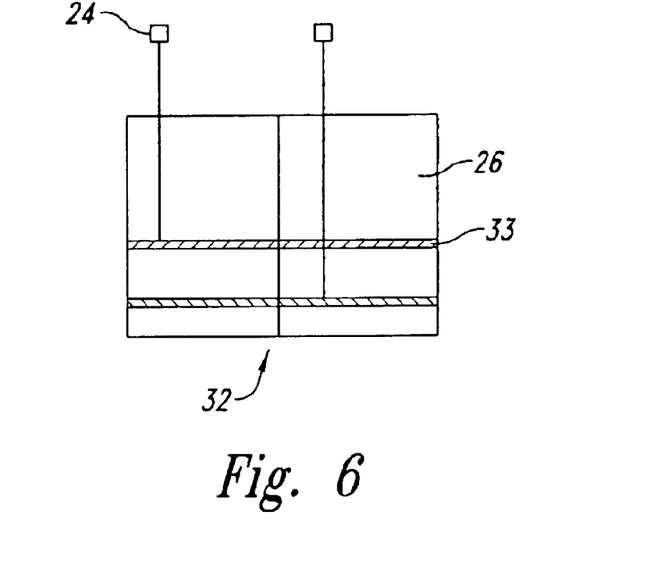
FIG. 6: shows the abutment of adjacent IO cells.

The IO circuits preferably abut in the X axis via supply/ground rings, as shown in FIG. 6. As can be seen, power/ground rings 33 abut at the joint 32 between two adjacent IO cells 26. This simplifies the layout.

5. Supply/Ground Abutment

Figure 7:
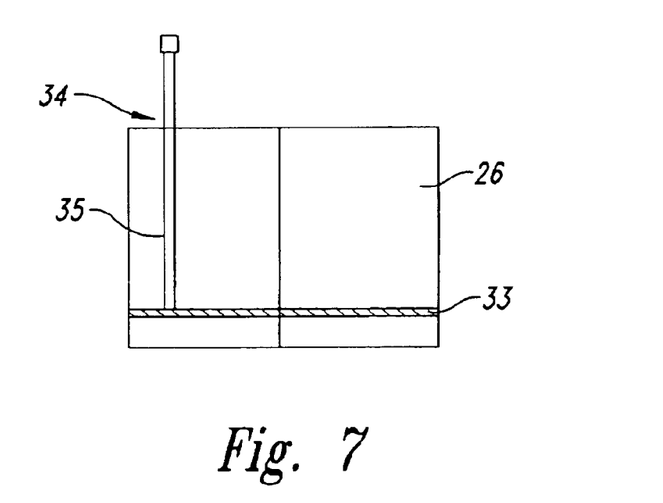
FIG. 7: shows the abutment of IO pads with supply/ground rings.

In a similar way, the supply/ground pads preferably abut in the Y axis onto IO supply/ground rings, as shown in FIG. 7. The abutment at joint 34 is between the pad and a metal path 35 to the power/ground ring 33.

6. ESD Ratio

ESD cells are preferably provided at the same ratio as supply pads for the active core. This is the VDD/VSD 30 as shown in FIGS. 4(c) and 5(c). This is based on the appreciation that ESD protection is not required with every IO supply/ground pad. Although ESD cells are shown for core supply/ground, in fact they may protect either core or IO cells through connections made using power/ground rings.

7. ESD Requirement

The frequency of ESD circuits should, nonetheless, be appropriate to the circuit following ESD guidelines.

8. Pad Pitch

The abstract of the pad (area 21 in FIG. 3) remains at the pad pitch to facilitate chip integration.

9. Physical Pad

The physical pad is a combination of a pad abutted to an IO or ESD cell.

10. Corner Rules

At the corners of a circuit, as shown in FIG. 1, extra fillers will be required to allow cells to abut one another.

The abutment of cells and power/ground rings are shown in FIGS. 6 and 7. A VDD/VSS pad 24 connects with a power/ground ring 33 overlying the IO cells 26. Adjacent cells abut at 33 so that the power/ground rings connect. Similarly, the pads abut the IO cells at 34 to provide connections to the power/ground rings via metal connections 35.

In a similar way, connections are established with the active core circuitry. The ESD protection cells thereby connect through power/ground rings to protect other IO cells on the active core.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of producing a semiconductor circuit with an area saving in comparison with a conventional circuit using library cells, each of the circuits having active circuitry, an input/output interface comprising separate IO cells and pads for external connection to the active circuitry via the IO cells, comprising:

determining a ratio of power/ground pads to input/output pads for the interface in the conventional circuit;

determining a width of each IO cell of the conventional circuit;

producing IO cells of a width substantially equal to the width of each IO cell of the conventional circuit multiplied by a factor based on the ratio of power/ground pads to input/output pads, but of corresponding reduced height; and producing power/ground pads and input/output pads for connection to the IO cells of the semiconductor circuit grouped together in the ratio determined for the conventional circuit.

2. A method according to claim 1, comprising omitting ESD cells of the conventional circuit associated with one or more of the IO cells of the conventional circuit.

3. A method according to claim 1, comprising providing ESD cells of the semiconductor circuit at a frequency that is less than or equal to a frequency of supply/ground pads for the active circuitry of the semiconductor circuit.

4. A method according to claim 1, comprising providing ESD cells of the semiconductor circuit at less than a frequency of ESD cells for the conventional circuit.

5. A semiconductor circuit with an area saving in comparison with a usual arrangement having active circuitry, an input/output interface comprising separate IO cells and pads for external connection to the active circuitry via the IO cells, comprising:

IO cells of greater than normal width and corresponding reduced height, wherein the width is multiplied, compared to a width of the IO cells of the usual arrangement, by a factor based on a ratio of power/ground pads to input/output pads determined for the usual arrangement; and power/ground pads and input/output pads for connection to the IO cells of the semiconductor circuit, grouped together in the ratio of power/ground pads to input/output pads.

6. A semiconductor circuit according to claim 5, wherein the IO cells of the semiconductor circuit do not have associated ESD cells for supply/ground connection.

7. A semiconductor circuit according to claim 5, comprising ESD cells provided a frequency that is less than or equal to a frequency of supply/ground pads for an active circuitry of the semiconductor circuit.

8. A semiconductor circuit according to claim 5, comprising ESD cells at less than a frequency of ESD cells of the usual arrangement.

9. A semiconductor circuit, comprising:

active circuitry;

an input/output interface having a plurality of IO cells, one of the IO cells having associated IO and supply or ground pads but not having an adjacent ESD cell;

pads for external connection to the active circuitry via the input/output interface; and a separate ESD protection cell provided within the input/output interface for protection of the active circuitry and input/output circuitry.

10. A semiconductor circuit according to claim 9, wherein ESD cells are provided at a reduced frequency in comparison to usual.

11. A semiconductor circuit according to claim 9, wherein the IO cells occupy space that would be used by ESD cells in a usual arrangement, thereby saving semiconductor area.

12. A semiconductor circuit according to claim 9, wherein each IO cell is connected to at least one IO pad, and a supply or ground pad.

13. A semiconductor circuit according to claim 9, wherein the pads are arranged at a fixed pad pitch.

14. A semiconductor circuit according to claim 9, wherein each of the IO cells includes an electrical, connector extending across the IO cell and in contact with the electrical connector of an adjacent one of the IO cells, and the ESD protection cell includes an electrical connector extending across the ESD protection cell and in contact with the electrical connector of an adjacent one of the IO cells, such that the ESD protection cell provides ESD protection via the electrical connectors to the IO cells, including the one of the IO cells having associated IO and supply or ground pads but not having an adjacent ESD cell.

15. A semiconductor circuit, comprising:

active circuitry;

input/output circuitry; and pads for external connection to the active circuitry via the input/output circuitry; wherein the input/output circuitry includes a plurality of IO library cells of fixed width, the IO library cells having connected IO pads and supply or source pads in a fixed ratio; and at least a subset of the IO library cells includes supply/source connections, but no ESD circuitry connected directly with the supply/source connections.

16. A semiconductor circuit according to claim 15, wherein all of the IO library cells include supply/source circuitry.

17. A semiconductor circuit according to claim 15, wherein alternative IO cells include supply/source circuitry.

18. A semiconductor circuit according to claim 15, wherein ESD circuitry is provided for supply/source pads connected with the active circuitry.

19. A semiconductor circuit according to claim 15, wherein each IO cell has a width that is a multiple of a usual width, and a height the is reduced by substantially the same multiple.

20. A semiconductor circuit according to claim 15, wherein each of the IO library cells includes an electrical connector extending across the IO library cell and in contact with the electrical connector of an adjacent one of the IO library cells, the semiconductor circuit further including an ESD protection cell having an electrical connector extending across the ESD protection cell and in contact with the electrical connector of an adjacent one of the IO library cells, such that the ESD protection cell provides ESD protection via the electrical connectors to the IO library cells, including the subset of the IO cells that includes supply/source connections but no ESD circuitry connected directly with the supply/source connections.

* * * * *

UNITED STATES PATENT AND TRADEMARK OFFICE
CERTIFICATE OF CORRECTION

PATENT NO. : 6,807,078 B2
DATED : October 19, 2004
INVENTOR(S) : William Thies et al.

It is certified that error appears in the above-identified patent and that said Letters Patent is hereby corrected as shown below:

<u>Title page,</u>
Item [30], Foreign Application Priority Data, date should read as
-- August 24, 2001 --.

<u>Column 6,</u>
Line 41, "an electrical, connector" should read as -- an electrical connector --.

Signed and Sealed this

Twenty-fourth Day of May, 2005

JON W. DUDAS
*Director of the United States Patent and Trademark Office*